United States Patent [19]

Haynes et al.

[11] 4,348,754
[45] Sep. 7, 1982

[54] DIGITAL DELAY FOR HIGH QUALITY AUDIO USE

[75] Inventors: David L. Haynes, San Mateo; John M. Brennan, San Jose, both of Calif.

[73] Assignee: Ampex Corporation, Redwood City, Calif.

[21] Appl. No.: 149,819

[22] Filed: May 15, 1980

Related U.S. Application Data

[63] Continuation-in-part of PCT/US79/00314, May 11, 1979, which designated the United States of America, abandoned.

[51] Int. Cl.³ .................... G11B 3/00; G11C 15/00
[52] U.S. Cl. ........................... 369/60; 369/51; 369/132; 365/194; 364/200; 364/900
[58] Field of Search ............... 179/100.4 C, 15.55 R, 179/15.55 T, 1 SM; 360/7, 8, 32, 36; 365/194, 239, 195; 364/728, 200, 900; 369/132, 133, 60, 51

[56] References Cited

U.S. PATENT DOCUMENTS

| | | | |
|---|---|---|---|
| 2,611,038 | 9/1952 | Graham | 179/100.4 C |
| 2,738,385 | 3/1956 | Bachman | 179/100.4 C |
| 3,934,094 | 1/1976 | Kobayashi | 179/15.55 A |
| 3,950,635 | 4/1976 | Constant | 364/728 |
| 4,064,395 | 12/1977 | Schubeler | 364/900 |
| 4,121,058 | 10/1978 | Jusko | 179/15.55 T |
| 4,157,460 | 6/1979 | Bottali | 179/100.4 C |
| 4,215,376 | 7/1980 | Moch | 360/36 |

OTHER PUBLICATIONS

"An Audio Delay System Using Digital Technology" by Blesser et al., Journal of Audio Engineering Society, May, 1971, vol. 19, No. 5, p. 393.

Primary Examiner—Alan Faber
Attorney, Agent, or Firm—Robert K. Schumacher; Ralph L. Mossino; Joel D. Talcott

[57] ABSTRACT

A disk mastering preview system utilizes an original audio signal from an audio source for previewing signals to be recorded by a disk lathe. Delayed audio signals corresponding to the original audio signals are produced for recording by the disk lathe a predetermined time delay thereafter. The original audio signals are sampled periodically by a sample and hold circuit to produce analog sample signals indicative of the signals sampled. An analog to digital converter converts the analog sample signals to corresponding digital sample signals. Successive digital sample signals are written into successively addressed memory locations and read out an adjustable predetermined number of memory addresses subsequently. A digital to analog converter converts the digital sample signals read out of memory into analog signals for recording. The predetermined number of addresses is set in a time delay register which produces a signal indicative of the number. The addressing of the locations is counted by a counter that produces a signal indicative thereof. The two signals are compared in a comparator. When the address count reaches the predetermined count, the comparator provides a signal that causes the addressing cycle to begin anew, thus producing the desired delay.

5 Claims, 11 Drawing Figures

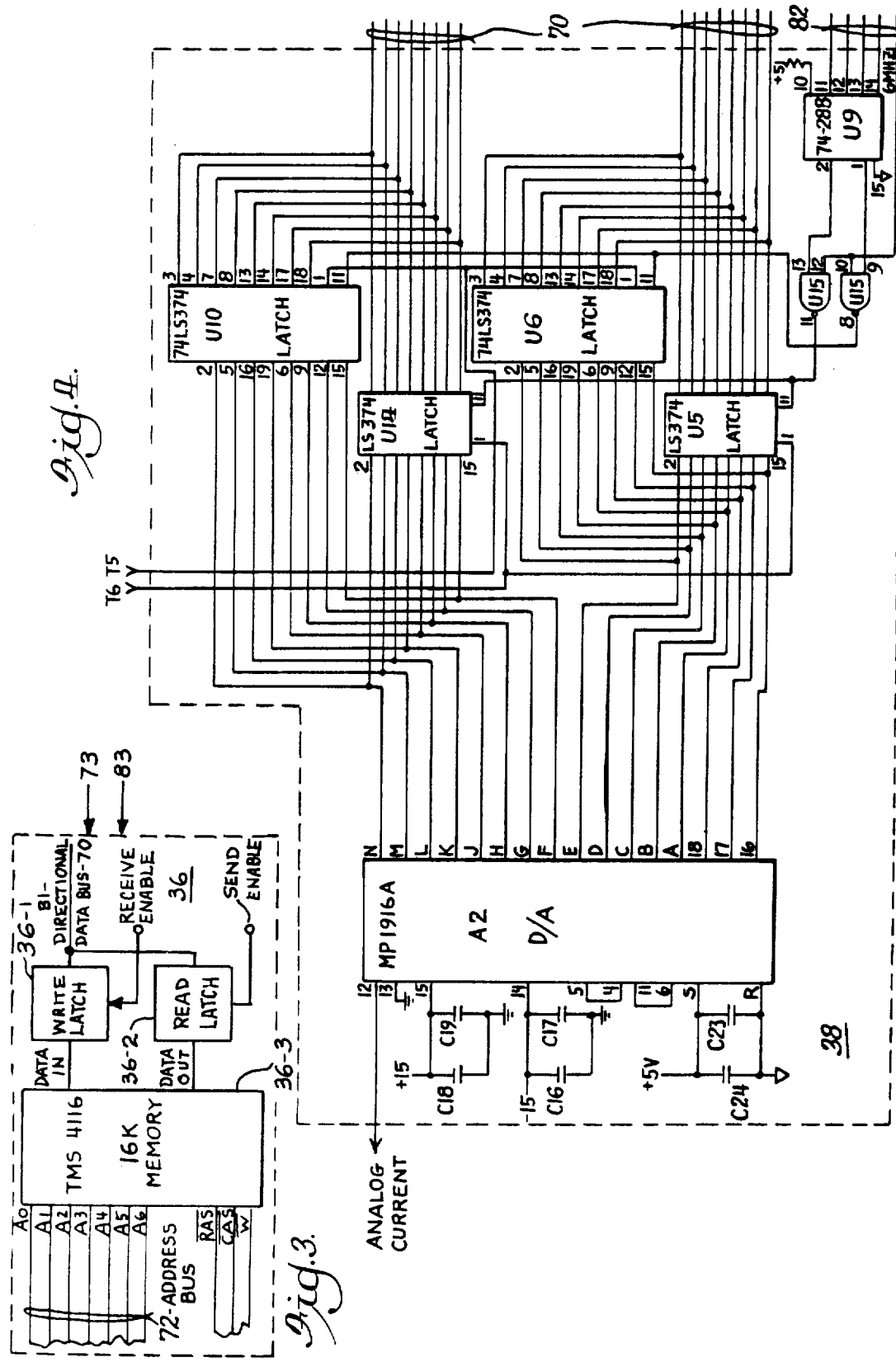

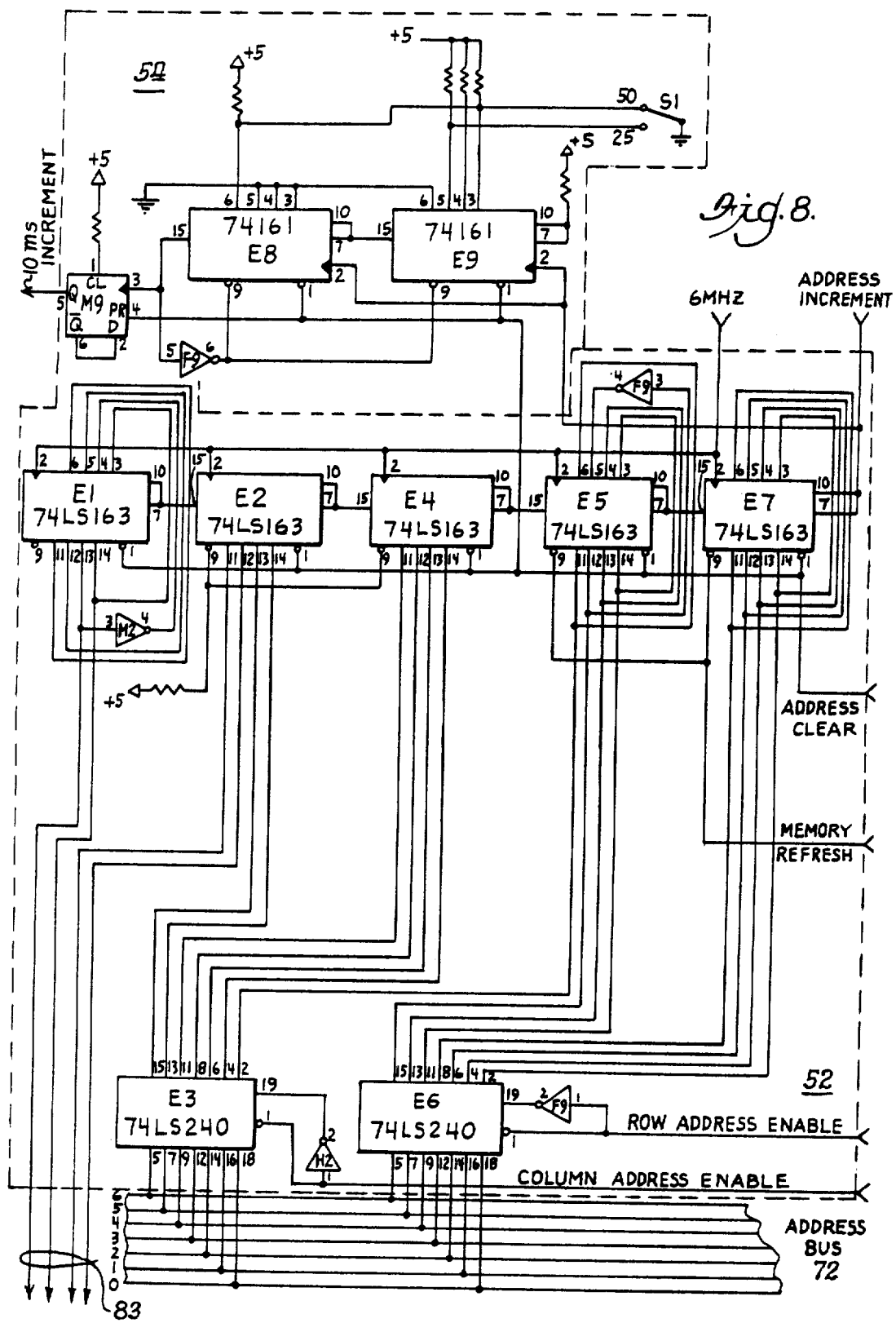

DIGITAL DELAY FOR HIGH QUALITY AUDIO USE

This application is a continuation-in-part of our pending application filed under the provisions of the Patent Cooperation Treaty, Ser. No. PCT/US 79/00314, filed on May 11, 1979.

This invention relates generally to digital delay systems for use in high quality audio systems and particularly such systems for providing an appropriate delayed audio signal for use in controlling record disk cutting lathes. More particularly, the present invention relates to a digital delay system for use in high quality audio recorders wherein an audio signal is digitized and then delayed a predetermined interval of time that is determined digitally.

Variable pitch record cutting lathes that are in use today require knowledge of the audio signal received at the cutter head. The knowledge is required approximately one revolution before the cutter head records the signal. A preview of the signal is used to set the groove pitch of the disk cutting lathe, the pitch being modulated by the maximum amplitude of the signal to be recorded. This permits optimum packing of the grooves to maximize the recording time on a single record, while increasing the groove pitch for recording large amplitude signals to assure space between adjacent grooves. It is the common practice to achieve such preview by placing extra guides between two play heads on an analog tape recorder to provide a tape loop delay. These guide positions are variable to change tape path length to provide the desired delay required at a given tape speed.

This prior art system has a number of disadvantages, not the least of which is loss of fidelity as occasioned by wow and flutter. It also has limited recorder shuttle speed, and currently only one format, open reel ¼" analog tape can be used.

It has been proposed to place analog delay devices in the signal path between the audio signal source and the disk cutting lathe to provide the necessary delay for previewing. However, the long delay required for previewing necessitates a sizable delay device; and a sizable delay device degrades the quality of the analog signal passing through it. Furthermore, analog delay devices are not easily adaptable to provide a delay that is adjustable throughout its range. In record cutting lathe previewing operations, the delay required can vary widely because it is a function of both the lathes system delay and the RPM of the record being cut. Consequently, analog delay devices are not well suited for universal use with variable pitch record cutting lathes.

The present invention overcomes the aforementioned limitations and disadvantages of the prior art delay devices by digitally delaying the audio signal from the playback source, thereby providing two signals, the original and a delayed copy. According to a preferred form of the present invention, the original analog signal is first passively low-pass filtered so that very little signal exists above the Nyquist frequency for the system. The signal is then sampled and each sample held for a period while it is converted by means of a successive approximation analog to digital (A/D) converter to a 16-bit digital representation. A microprogrammed controller controls a bi-directional data bus which allows the digital representation of the signal to be placed in its proper place in memory and recovered after the proper time delay.

The memory is accessed sequentially, and the digital samples of data are written into and read out of memory in sequential order by incrementing an address counter once for each sample. When the address counter reaches the end of the allotted memory, the address counter is cleared, and the process starts again at the beginning of memory. To achieve this, the operator enters the desired amount of time delay into a desired time delay register by means of front panel controls. A current time delay counter keeps track of how far into memory the address counter is in terms of time referenced to memory location zero. The outputs of the time delay register and the current time delay counter are compared by a comparator. When the two are equal, the comparator output is used by way of the microprogrammed controller to clear the address counter. The conversion from memory address to time is done by an address to time delay converter. The converter is a divider which divides the address incrementing line. It counts the number of increments necessary to create a 10 ms delay, and then increments the current delay counter, which is thus incremented in units of 10 ms. When a delayed signal is fetched from memory, it is transferred into a digital to analog (D/A) converter. The analog output of the D/A converter is then deglitched in the analog domain, and a filter is used to suppress spectral products above the Nyquist frequency and provide a reconstituted analog audio signal at its output. The reconstituted analog signal is then available as a delayed copy of the original.

Thus, it is a primary object of the present invention to provide a disk mastering preview system having an adjustable digital delay. It is a further object of the invention to provide a digital delay system utilizing the effective size of a digital memory for creating the delay, wherein the effective size of the memory is a function of the delay desired and is determined by comparison of the memory address with a desired delay signal as selected by the operator.

Other objects and advantages of the present invention will become evident from consideration of the following detailed description, particularly when taken in conjunction with the accompanying drawings in which:

FIG. 3 is a partial, simplified circuit diagram illustrating a preferred form of the memory utilized in the system illustrated in FIG. 1;

FIG. 4 is a circuit diagram illustrating a preferred form of the D/A converter utilized in the system illustrated in FIG. 1;

Figure 1:
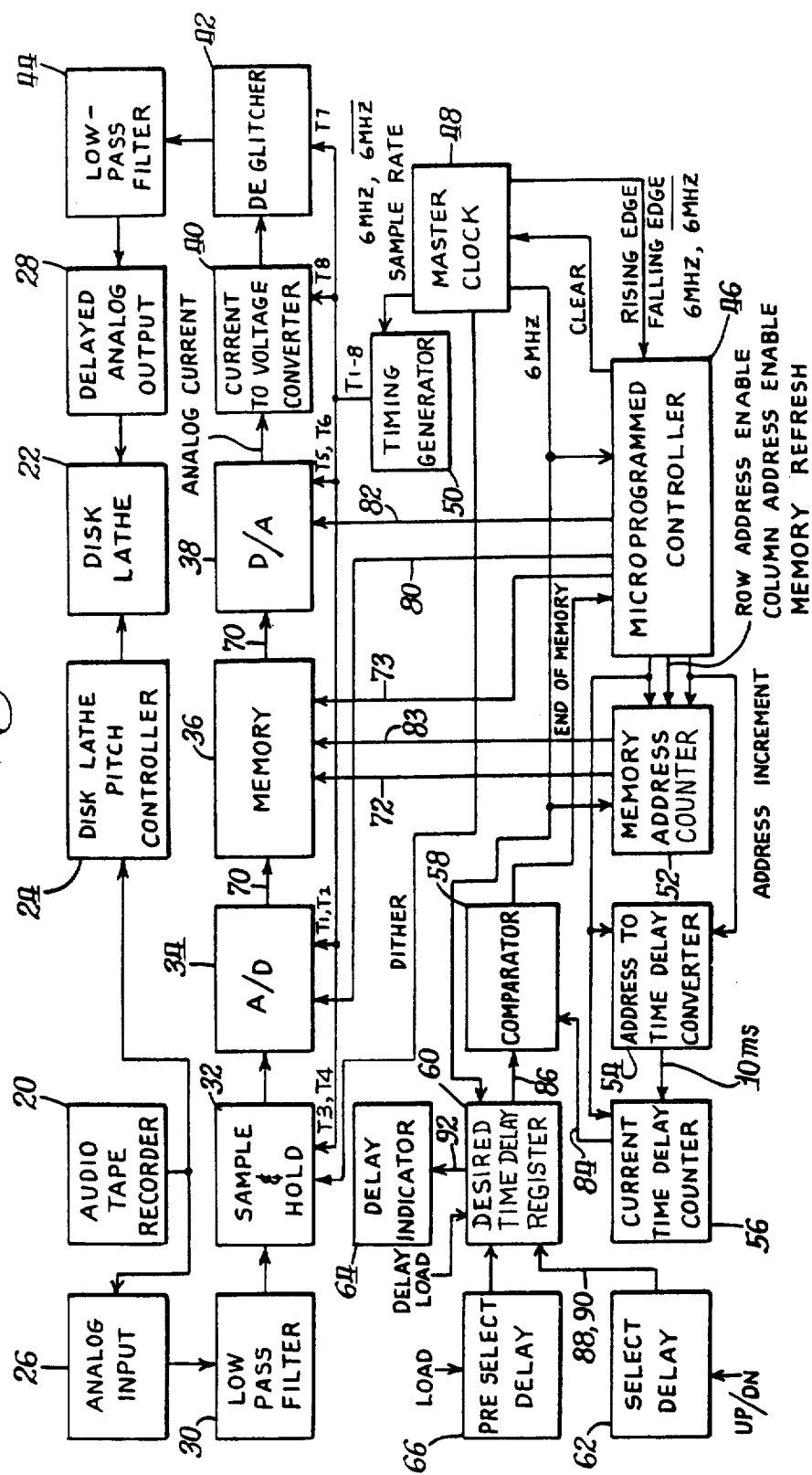
FIG. 1 is a block diagram of a system for controlling a disk lathe utilizing a form of the present invention including controlled digital delay.
Figure 7A:
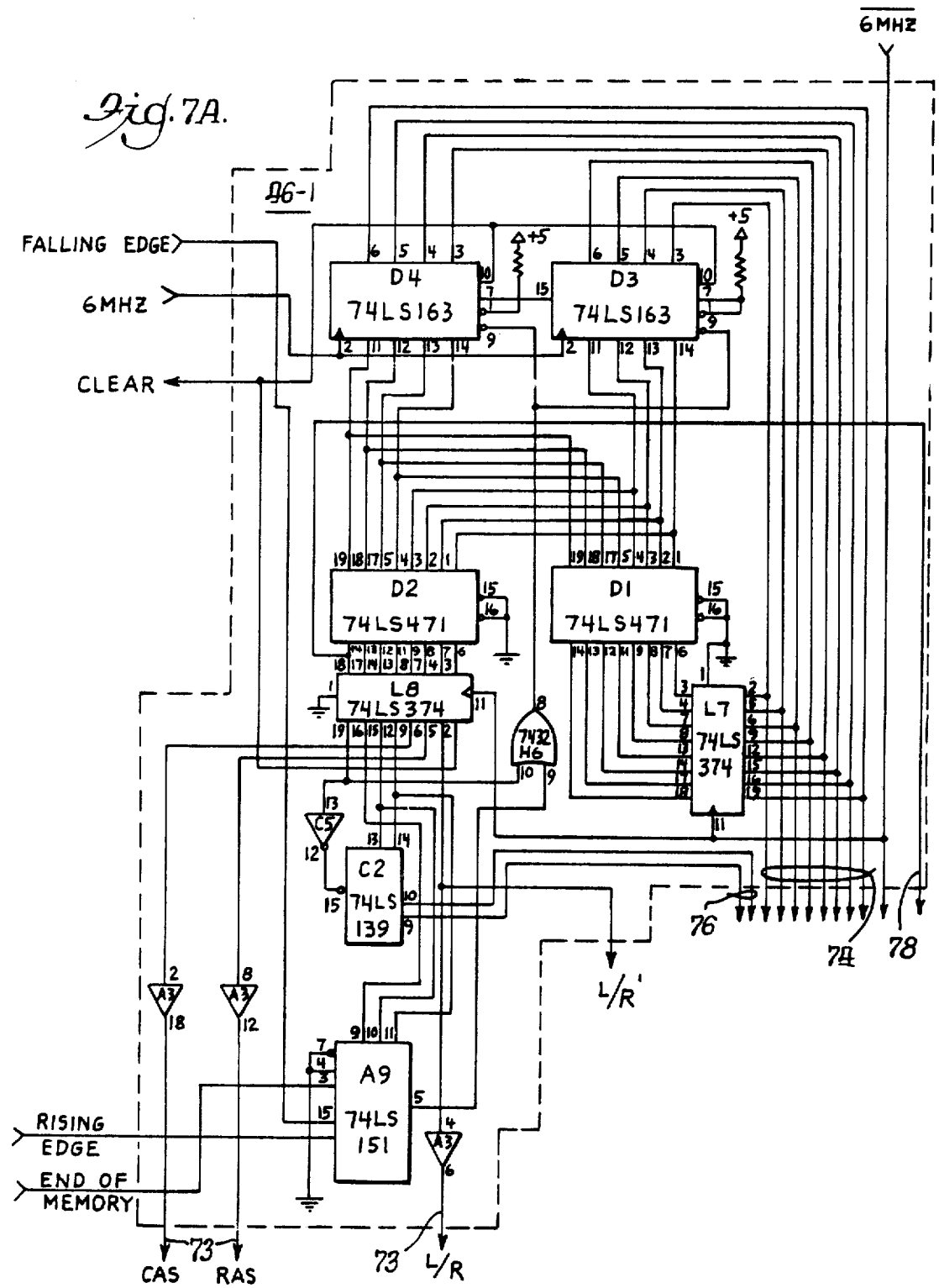
Figure 7B:
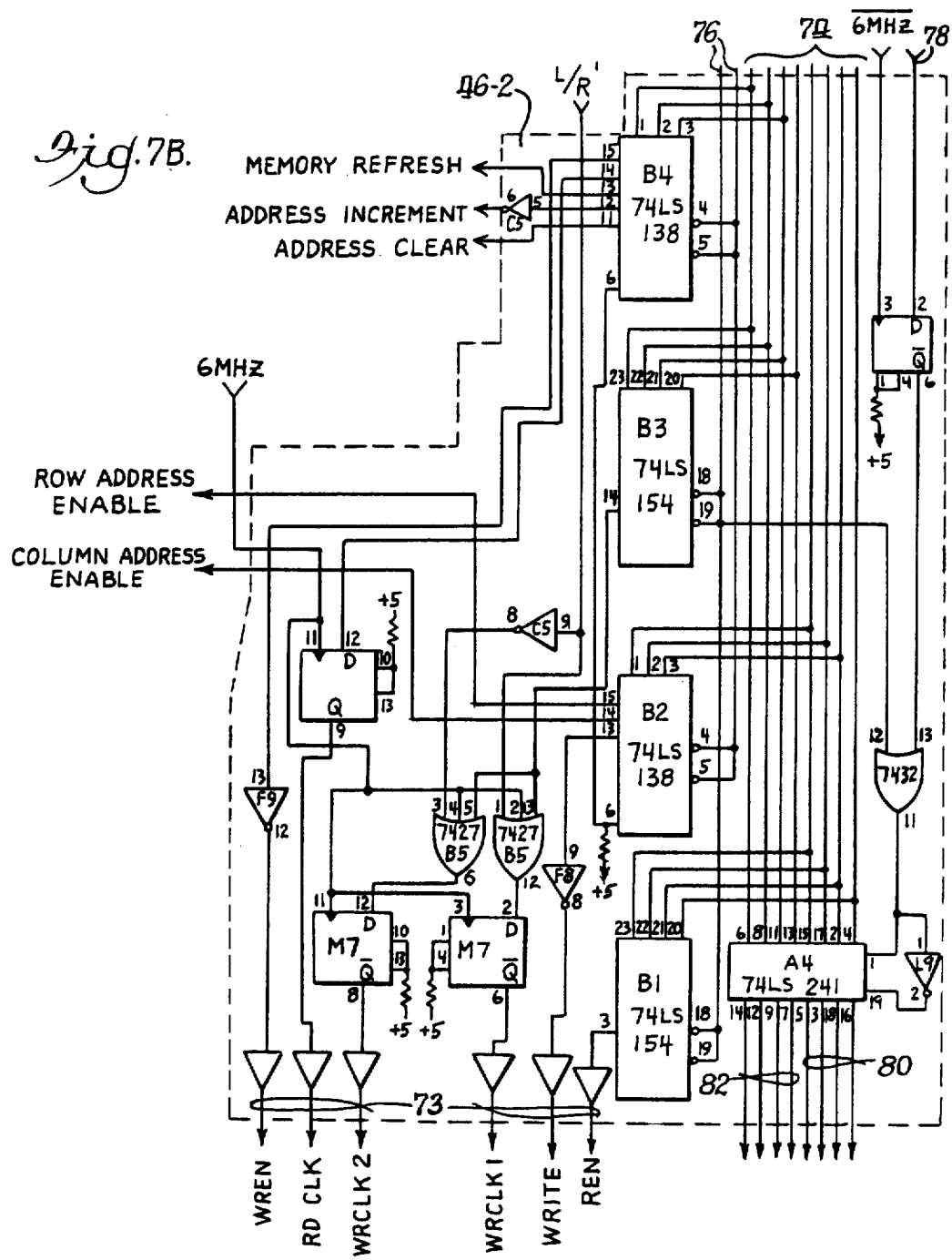
Figure 9:
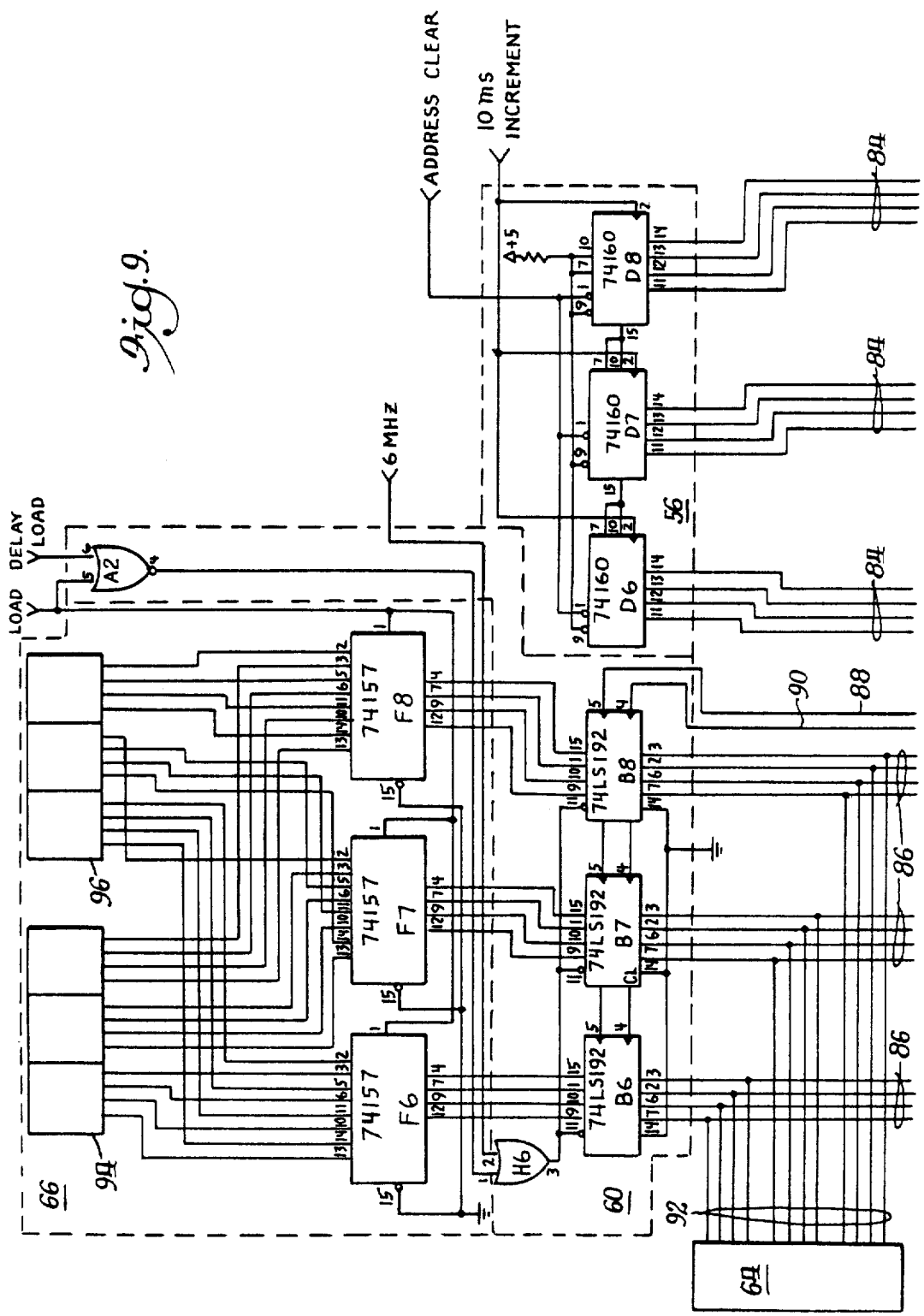
Figure 10:
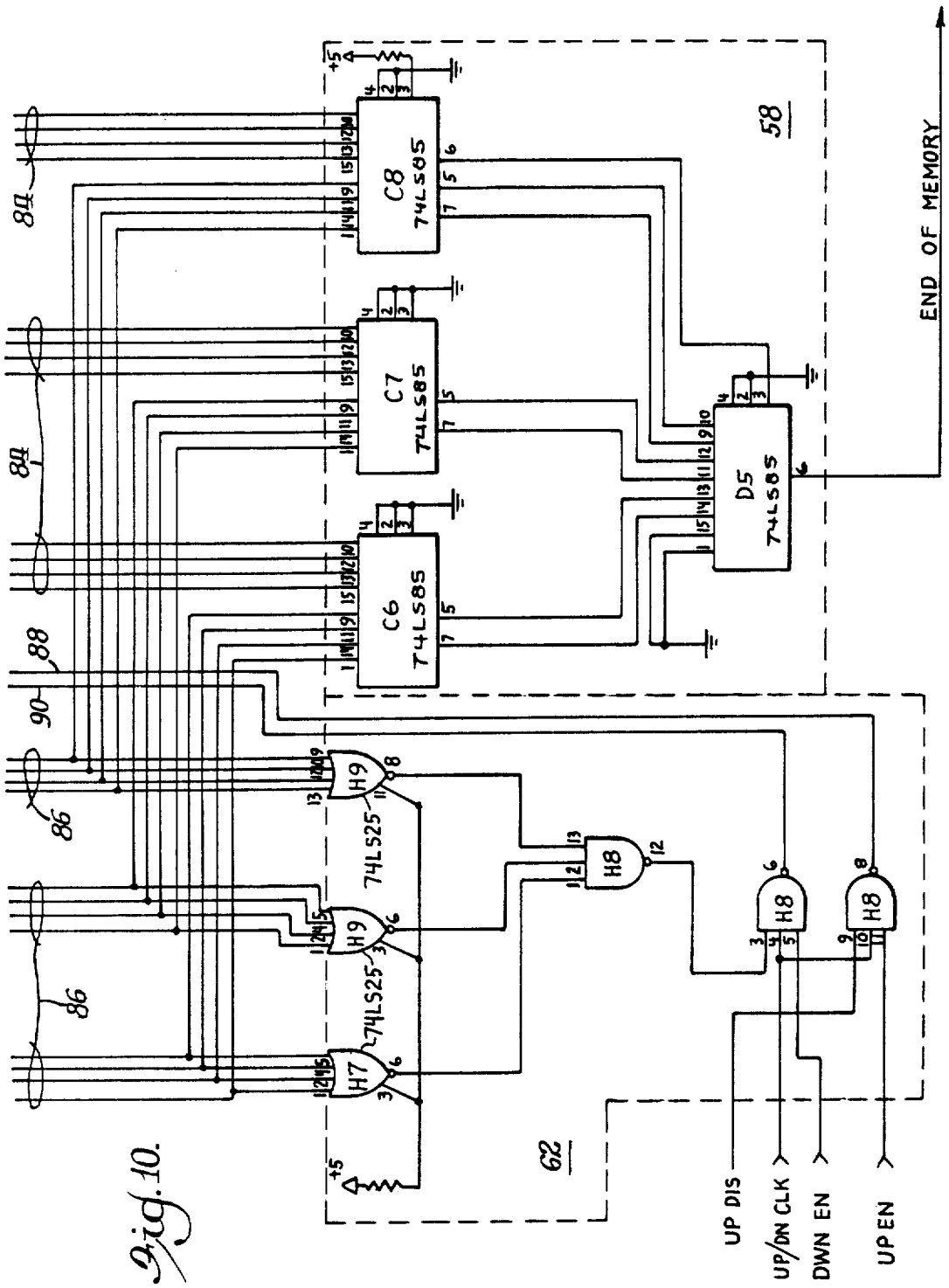

FIGS. 7A and 7B comprise a circuit diagram illustrating a preferred form of microprogrammed controller utilized in the system illustrated in FIG. 1;

FIG. 8 is a circuit diagram illustrating preferred forms of memory address counter and address to time delay converter circuits utilized in the system illustrated in FIG. 1;

FIG. 9 is a circuit diagram illustrating preferred forms of preselect delay, desired time delay register and current time delay counter circuits utilized in the system illustrated in FIG. 1; and FIG. 10 is a circuit diagram illustrating preferred forms of select delay and comparator circuits utilized in the system illustrated in FIG. 1.

As illustrated in FIG. 1, analog audio signals recorded on a master tape are reproduced by an audio tape recorder 20 for re-recording on conventional record disks. These signals are cut by a disk lathe 22 into blank disks. The audio signal reproduced by the audio tape recorder 20 is applied to a disk lathe pitch controller 24 which operates in a conventional manner to control the pitch at which the grooves are cut by the disk lathe 22 into a blank disk.

The signal to be recorded is delayed following the reproduction by the audio tape recorder 20. The reproduced signal is applied from the audio tape recorder 20 to an analog input circuit 26 and after delay is applied from a delayed analog output circuit 28 to the disk lathe 22. The analog input circuit 26 and the analog output circuit 28 are interface circuits that serve to translate signals to the levels required by the digital delay system and disk lathe, respectively, and are of conventional construction determined by the particular designs of the devices selected for sending and receiving the signals. The output signal from the delayed analog output circuit 28 corresponds to the audio signal applied to the analog input circuit 26 from the audio tape recorder 20, but delayed by a predetermined desired time interval.

The audio tape recorder 20 may be a standard two channel recorder/reproducer such a that sold as ATR-100 by Ampex Corporation, Redwood City, Calif. The disk lathe 22 may be any of a number of commercial disk lathes, and the disk lathe's pitch controller 24 may be any commercial disk lathe pitch controller appropriate for controlling the pitch of the disk lathe 22.

The manner of producing the delayed output signal will be described initially in conjunction with the digital delay system illustrated in block diagram form in FIG. 1. The system will be described first in a simplified manner as though there were but a single channel being recorded. In fact, however, the preferred embodiment as shown in greater detail in FIGS. 2 through 10 is a two channel system, with capabilities for extension to four channels.

As shown in FIG. 1, the analog input circuit 26 receives an audio input signal from the audio tape recorder 20 and applies it in appropriate form to a low-pass filter 30. This low-pas filter operates to cut off the high frequency components of the audio signal. As the signal is subsequently to be sampled in connection with analog to digital conversion, the low-pass filter is utilized to eliminate aliasing distortion. Such distortions are produced when signals are sampled that have a frequency greater than one-half the sampling frequency. By providing a relatively sharp cutoff, low-pass filter having a cutoff frequency of about 40% of the sampling frequency, aliasing distortion can be reduced to a level that is not objectionable to a listener of the audio recorded on the disk. In the present invention, a filter cutoff frequency of about 20 kHz and a sample frequency of 50 kHz will assure that the cutoff frequency is about 40% of the sampling frequency.

The filtered audio signal is then applied to a sample and hold circuit 32. As stated above, the sampling frequency is, at least in a preferred form of the invention, 50 kHz and, hence, samples the audio signal at a frequency much higher than any components of the filtered audio signal. This assures that the sample adequately characterizes the original signal. Each sample is then held for a period sufficient to enable it to be transferred to the next operation as performed by an A/D converter circuit 34.

The A/D converter circuit 34 accepts each sampled signal and converts the analog sample signal to digital form, which is then coupled for application to a memory 36.

Each digitized sample signal is stored in the memory 36 for a predetermined interval of time, namely, the time desired for the delay of the signal. The delayed signal is then called up out of memory to a D/A converter circuit 38.

The D/A converter circuit 38 operates to convert the digital signal received from the memory 36 into an analog current signal. The analog current signal is applied to a current to voltage converter circuit 40, which produces a corresponding analog voltage signal. This analog voltage signal is then applied to a deglitcher circuit 42 which operates to eliminate glitches from the recovered analog signal as might otherwise be occasioned by the D/A conversion. The recovered analog signal is then applied from the deglitcher circuit 42 to a low-pass filter 44.

The low-pass filter 44 may be substantially the same as the low-pass filter 30 and operates to cut off all signal components of frequencies above those contained in the signal passing the low-pass filter 30 and provide a reconstituted analog audio signal at its output. That is, it suppresses all parts of the spectrum above the frequencies contained in the original signal, hence eliminating any high frequency distortion that may have been created in the sampling process. The filtered signal from the low-pass filter 44 is then applied to the delayed analog output circuit 28 for application to the disk lathe 22.

The operation of the conversion and delay circuits is controlled by a microprogrammed controller 46, a master clock circuit 48 and a timing generator 50. The microprogrammed controller 46 operates to control a memory address counter 52 to access the memory circuit 36 sequentially so that samples of data in digital form are written into and read out of memory in sequential order by incrementing the address counter once for each sample, that is, at 50 kHz in this example.

The microprogrammed controller 46 also applies address increment signals to an address to time delay converter circuit 54 which counts address increments up to the number that is equivalent to a particular time interval, specifically, for example, 10 ms. The address to time delay converter circuit 54 thus produces an output pulse each 10 ms. Such pulses are applied to a current time delay counter 56 which provides a count of such 10 ms intervals. The output of the current time delay counter 56 is in the form of a digital output indicative of the number of 10 ms time intervals that have occurred since the counter was last cleared.

The digital output of the current time delay counter 56 is applied to a comparator 58 which compares the output of the current time delay counter 56 with the output of a desired time delay register 60 and provides a digital signal corresponding to the time delay desired.

Thus, the current time delay counter 56 counts the 10 ms intervals until the comparator 58 notes that the number of intervals corresponds to a count present in the desired time delay register 60, at which time the comparator 58 provides an appropriate signal to the microprogrammed controller 46 informing the microprogrammed controller that the desired delay has occurred. The microprogrammed controller 46 then produces an instruction to clear the memory address counter 52 to restart the sequence of memory addresses corresponding to the length of the desired delay.

The aforedescribed counting and clearing operations continue repeatedly throughout the making of the record whereby the memory address counter 52 is cleared at intervals determined by the desired time delay set into the desired time delay register 60. As a result of the repeated clearing of the memory address counter 52, the same sequence of address signals is repeatedly generated by the counter whereby the same sequence of address locations of the memory circuit 36 is periodically accessed at intervals determined by the desired time delay. For different desired time delays set into the desired time delay register 60, different numbers of 10 ms intervals are counted by the current time delay counter 56 to cause the microprogrammed controller 46 to produce the instruction to clear the memory address counter 52. Thus, the number of address locations of the memory circuit 36 used to provide the desired time delay is a function of the desired time delay; and it is not necessary to provide access to all memory locations in the memory circuit to provide the desired time delay. This feature of the digital delay has the advantage of predictability of storage location of the digitized sample signals written into the memory circuit 36 because samples provided by the A/D converter 34 consecutively at intervals equal to the desired time delay are written into the same address location of the memory circuit.

During each addressing interval of a memory location, the memory circuit 36 first receives a read signal that causes a previously stored digitized sample signal to be read out from the memory location of the memory and, later in the addressing interval, a write signal that causes a new digitized sample signal received from the A/D converter 34 to be written into the same memory location. The digitized sample signals read out from the memory circuit 36 are provided to the D/A converter 38 for conversion back to analog form and application to the disk lathe 24 with a delay corresponding to that set in the desired time delay register 60.

The time delay preset into the desired time delay register 60 may be whatever the operator desires within the limits set by the capacity of the memory circuit 36. In general, there are, as shown, two means for entering the desired time delay into the register 60. One is a select delay circuit 62 wherein the operator selects the desired delay by means of pushbutton switches (not shown). A delay indicator 64 indicates what delay is registered in the desired time delay register 60 in order that the operator may see what delay he is selecting. The second means for entering a time delay into the desired time delay register 60 is by way of a preselect delay circuit 66. This circuit provides two fixed predetermined time delay signals which may be selected for introduction into the desired time delay register 60 as the desired time delay count by merely pushing a single pushbutton. This is advantageous where there are but a few particular delays that are regularly required, as, for example, in cutting 33⅓ or 45 RPM records. In that case, one of the preselected delays is the time of a single rotation of the 45 RPM record and the other for the 33⅓ RPM record.

Specific circuits for use in the system illustrated in FIG. 1 are shown in FIGS. 2 through 10. The system will be described hereinafter for two channel recording.

In the case of two channel recording, the analog input circuit 26 will comprise two input circuits and the low-pass filter 30 will comprise two separate low-pass filters, one for each of the channels of audio signals being simultaneously recorded on the blank disk. Circuits illustrative of the analog input circuit 26 and the low-pass filter 30 are not illustrated in detail, however, as these are standard circuits of which any of a number of circuits can be used.

Figure 2:
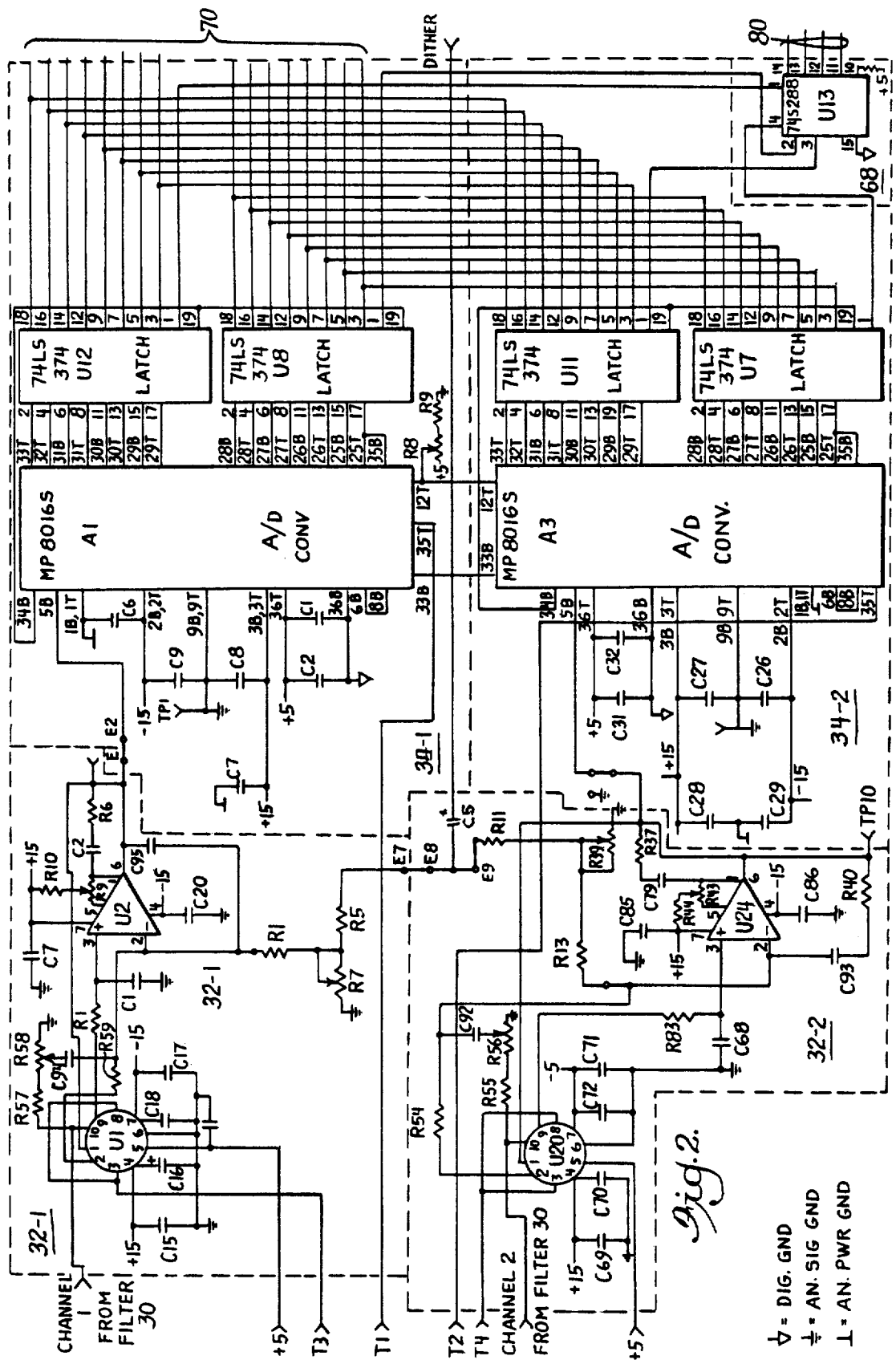
FIG. 2 is a circuit diagram illustrating preferred forms of the sample and hold and A/D converter circuits utilized in the system illustrated in FIG. 1.

A preferred form of a sample and hold circuit 32 and associated A/D converter circuit 34 for two channel recording is shown in FIG. 2. As there shown, two separate sample and hold circuits 32-1 and 32-2 and following two separate A/D converter circuits 34-1 and 34-2 are provided, one for each channel. The analog signal from the channel 1 low-pass filter 30 is applied to pin 10 of a FET switch U1 of the sample and hold circuit 32-1, while the analog signal from the channel 2 low-pass filter 30 is applied to terminal 10 of a FET switch U20 of the sample and hold circuit 32-2. Upon application of a timing pulse T3 from the timing generator 50 to pins 3 and 8 of the FET switch U1, the FET switch applies the input signal at pin 10 to pin 9 to transfer the signal to a holding capacitor C1. The holding capacitor C1 retains the sampled signal after the timing pulse is removed. This signal is buffered by an amplifier U2 and applied to the channel 1 A/D converter circuit 34-1, more particularly, to pin 5B of the A/D converter device A1 included in the channel 1 A/D converter circuit 34-1. Similarly, the channel 2 signal applied to the FET switch U20 of the sample and hold circuit 32-2 is sampled upon appearence of a timing pulse T4 applied by the timing generator 50 to terminals 3 and 8 of the FET switch U20. The sampled signal is held on a holding capacitor C68, buffered by an amplifier U24 and applied to the terminal 5B of the A/D converter device A3 included in the channel 2 A/D converter circuit 34-2.

The A/D converter devices A1 and A3 are shown as type MP8016S Analogic A/D converters, which provide on their output terminals 16-bit digital signals coresponding to the applied analog signals received from their associated buffer amplifier U2 and U24. The A/D converter device A1 operates upon command of the timing pulse T1 generated at the appropriate time by the timing generator 50 and applied to the terminal 35T of the converter device A1. The converter then develops the appropriate binary signals on the output terminals, and when the conversion of a given analog input signal is complete, a completion signal is developed on the terminal 34B. The 16-bit output signals are applied to respective latches U12 and U8, each of which may be of type 74LS374. Upon the appearance of the completion signal on the terminal 34B of the A/D converter device A1, this signal is applied to load command terminals 19 of the latches U12 and U8 to transfer the data from the output of the converter device A1 into the latches U12 and U8.

Upon application of a command signal to the respective terminals 1 of the latches U12 and U8 generated by a decoding circuit 68 in the A/D converter circuit 34, the signals contained in the latches U12 and U8 are applied to respective conductors of a data bus 70, whence the signals are connected to the memory 36. The command signals applied to terminals 1 of the latches U12 and U8 are produced at appropriate times by the decoding circuit 68 from signals received over a sender control bus 80 from the microprogrammed controller 46.

Similarly, a timing pulse T2 generated by the timing generator 50 and applied to terminal 35T of the A/D converter device A3 causes the channel 2 sampled signal to be converted to digital form which, upon completion of the conversion, is transferred to the corresponding digital output in 16-bits to latches U11 and U7 of the A/D converter circuit 34-2. Upon the application of command signals to terminals 1 of latches U11 and U7 generated by the decoding circuit 68, the digital sample signals in the latches U11 and U7 are applied to the data bus 70 for transmission to the memory 36.

As will be explained in further detail hereinbelow with reference to the preferred timing generator 50 illustrated in FIG. 5, the timing pulses T1, T2, T3 and T4 are generated at a 50 kHz rate at particular times relative to the occurence of a timing reference edge of the 50 kHz square wave SAMPLE RATE signal generated by the master clock generator 48 and applied to the timing generator 50. In general, however, the timing pulses T3 and T4 serve as the sampling signals for the two channels of analog audio signals and are simultaneously generated and applied to the FET switches U1 and U20 by the timing generator 50. Following an interval that permits the sample and hold circuits 32-1 and 32-2 to settle after each sampling of the analog audio signals, typically 2 us in circuits of the type employed in the preferred sample and hold circuits illustrated in FIG. 2, timing pulses T1 and T2 are simultaneously generated and applied to the A/D converter devices A1 and A2 by the timing generator 50. As explained above, these timing pulses cause the A/D converter devices to convert the analog sample signals and hold circuits to corresponding 16-bit binary digital sample signals.

With respect to the decoding circuit 68, the microprogrammed controller 46 issues a pair of consecutively 4-bit binary state signals over the sender bus 80 at times during its execution of the stored control program. The decoding circuit 68 responds to the consecutively received 4-bit binary state signals by activating its output lines to enable the latches U7, U8, U11 and U12 to transfer to their outputs the digital sample signal provides at their inputs by their associated A/D converter devices A1 and A3. The sequence of 4-bit binary state signals received by the decoding circuit 68 is such that the latches U8 and U12 associated with the channel 1 A/D converter device A1 are first enabled and then latches U7 and U11 associated with the channel 2 A/D converter device A2 are enabled. The transfer of the digital sample signals to the outputs of the latches results in the sending of the signals to the following memory circuit 36. The manner in which the 4-bit binary state signals are generated will be described hereinbelow with reference to the preferred microprogrammed controller 46 illustrated in FIGS. 7A and 7B.

In FIG. 3 is illustrated a very simplified version of the memory 36, showing but one of many memory arrays, and consequently not showing the specific circuitry for addressing the respective arrays separately and for timing internal transfer of data. The single memory array is shown as a 16 k memory array of type TMS4116. It is a 128×128 array of memory cells. It receives address signals over a seven line address bus 72 on lines A0 to A6. A row address select terminal receives row address select not signals $\overline{RAS}$. A column address select terminal receives column address select not signals CAS. A read/write terminal receives write not signals $\overline{W}$. Channel 1 and channel 2 data are transmitted to and from the memory 36 as 16-bits of binary data. However, in a preferred form of the digital display system, 32-bits of data are simultaneously written in and read out of storage in the memory 36, with each 32-bits of data consisting of 16-bits of channel 1 and 16-bits of channel 2 data. The transfers between the 16-bit and 32-bit lengths are performed by write and read latches 36-1 and 36-2, respectively, enabled by receive and send signals decoded from 4-bit binary state signals generated by the microprogrammed controller 46. The decoding is performed by decoders shown in FIG. 7B operatively coupled to the sender and receiver busses 80 and 82 that extend from the microprogrammed controller 46, which function in the manner described hereinabove with respect to the decoding circuit 68 illustrated in FIG. 2. Two write latches 36-1 and two read latches 36-2 are coupled to each one of the 16-bit lines of the data bus 70, with each one of the two write and two read latches also coupled to one of the 32-bit lines extending to the memory device 36-3. A first of each pair of write latches coupled to each one of the 16-bit lines is enabled in response to the issuance of a first of consecutive 4-bit binary state signals by the microprogrammed controller 46 to receive and hold the channel 1 binary bit signals output by the A/D converter 34. The second of each pair of write latches is enabled in response to the issuance of the second of the consecutive 4-bit binary state signals to receive and hold the channel 2 binary bit signals output by the A/D converter 34. The pairs of read latches are arranged to function in a similar manner, except the 32-bits of channel 1 and channel 2 binary data that are simultaneously accessed in the memory device 36-3 are transferred to the output of the read latches in two consecutive steps in response to consecutive 4-bit binary state signals issued by the microprogrammed controller 46. In the first step, 16-bits of channel 1 data are transferred to the bus 70 by a corresponding number of read latches including the first of each pair of read latches and, in the second step, 16-bits of channel 2 data are transferred to the bus 70 by a corresponding number of read latches including the other of each pair of read latches.

Each memory array or device 36-3 accepts one bit from each 32-bit word. Thus, 32 of these arrays are connected and simultaneously addressed in parallel to transfer all 32-bits of binary data, thereby providing simultaneous 32-bit input and output to and from the memory device 36-3. The respective memory addresses in each memory array 36-3 illustrated are addressed successively by application of successive address signals to the address bus 72. Each address signal is multiplexed, being applied in two parts, one the row address and the other the column address. The $\overline{RAS}$ and $\overline{CAS}$ signals transmitted to the memory 36 with the address signals identify whether row or column address signals are present on the address bus 72 so that each address is uniquely identified and selected. The address signals are applied to the address bus 72 from the memory address counter 52. The row and column address signals are developed in response to signals received by the memory address counter 52 from the microprogrammed controller 46. So, also, is the write not signal $\overline{W}$, which determines whether the memory is in a read or write state. The write not signal $\overline{W}$ maintains the memory 36 in the read state until a write operation is to be performed, at which time the write not signal $\overline{W}$ changes levels to place the memory 36 in the write state. For the sake of simplicity of explanation, the circuitry for developing and applying the control signals for the memory array are not shown. They may be conventional circuits as used for addressing and commanding large arrays of memory. The signals as sent from the microprogrammed controller 46 will be described further below in connection with the description of the controller.

In a preferred embodiment of the invention, the memory circuit 36 is constructed to provide up to 8 megabits of data storage. Since the aforedescribed 32 arrays arranged to store the 32-bit word formed of two digitized sample signals provide a capacity of only 524,288 bits, additional separately addressed blocks of 32 arrays are provided to store up to 8 megabits of data storage. Furthermore, the memory arrays 36-3 used in the construction of the memory circuit 36 requires refreshment every 2 ms. As will be described in further detail hereinbelow with reference to the detailed description of the memory address counter 52 illustrated in FIG. 8, such refreshment is achieved by particularly timed activation of row address lines during each addressing of the memory circuit 36.

FIG. 4 illustrates a preferred form of the D/A converter 38. Latches U5, U6, U10 and U14 have their inputs connected to the respective conductors of the data bus 70 and are enabled in pairs determined by consecutive 4-bit binary state signals generated by the microprogrammed controller 46 at times determined by its stored program and placed on the receiver bus 82 coupled to the input of the decoding circuit U9. The decoding circuit U5 responds to the consecutively received 4-bit binary state signals by activating its output lines to enable the latches U5, U6, U10 and U14 to receive and hold digital sample signals read out from the memory circuit 36. With the memory 36 in its read condition, as determined by the signals applied thereto by the microprogrammed controller 46, the decoding circuit U9 activates its output lines coupled to terminals 11 of the latches U10 and U6 to cause channel 1 digital sample signals received upon the data bus 70 to be latched into the latches U10 and U6. At some later appropriate time, as determined by timing pulse T5 applied from the timing generator 50 to pins 1 of the latches U10 and U6, the signals stored in latches U10 and U6 are output to the input terminals of a D/A converter device A2 which, as shown, is a D/A converter of Analogic type MP1916A. This D/A converter device A2 operates to convert the digital representations of channel 1 sample signals received at its input to corresponding analog current values or levels.

Similarly, upon receipt of appropriate activating signals from the decoder U9 and following timing pulses T6 from the timing generator 50, the appropriate channel 2 digital sample signals read out of the memory 36 are latched into latches U14 and U5 (which are comparable to latches U10 and U6, respectively) and applied to the D/A converter device A2 to develop an analog current value or level corresponding to the digital representation of each channel 2 digital sample signal. Since there is but a single D/A converter device A2 for both channels, the two signals appear alternately on the analog current output lead. The combined analog current signal is then applied to the current to voltage converter 40. The timing pulses T5 and T6 are generated by the timing generator 50 illustrated in FIG. 5 at a 50 kHz rate at particular times relative to the occurrence of a timing reference edge of the 50 kHz square wave SAMPLE RATE signal generated by the master clock generator 48 and applied to the timing generator 50. FIG. 5 illustrates the circuit details of preferred embodiments of the current to voltage converter 40 and deglitcher 42 that function to provide an analog sample voltage form of the analog sample current signal received from the D/A analog sample current signal received from the D/A converter 38 and eliminate any transients that might be introduced into the received signal by the digitalization process. In addition, the current to voltage converter 40 includes switching means that is operated to demultiplex the serialized two channel data received from the D/A converter 38 whereby the two channels of data that have been combined or multiplexed into a single serialized stream of data because of the use of a single D/A converter device A2 are placed into separate data transmission channels with the proper phase relationships. More particularly, a current to voltage converter circuit 40-1 receives the serialized analog sample current signal values from the D/A converter 38 and converts the serialized current values into corresponding analog sample voltage signal values. The analog sample voltage output provided by the converter circuit 40-1 is applied simultaneously to pins 1 of FET switches U22 and U6. As will be described in further details hereinbelow, FET switch U6 forms the switching means of a demultiplexing circuit 40-3 and is controlled to pass only channel 2 analog sample signals to a following resampling and hold circuit 40-2 for application to pin 1 of a FET switch U10. The two FET switches U22 and U10 respectively, allow channel 1 and channel 2 analog sample voltage signals to be input to the deglitcher circuits 42-1 and 42-2, and, thereby, remove any transients from the analog sample signals prior to being applied to the dual channel low-pass filter 44.

In operation, a timing pulse T8 from the timing generator 50 is applied to terminals 3 and 8 of the FET switch U6 to transfer each channel 2 analog sample voltage signal provided by the current to voltage converter circuit 40-1 to a capacitor C27 of the resampling and hold circuit 40-2. The capacitor C27 stores the channel 2 analog sample voltage signal value during the time that the current to voltage convert circuit 40-1 generates the following channel 1 analog sample voltage signal value. The stored channel 2 analog sample voltage signal is coupled to pin 1 of the FET switch U10. During the generation of the channel 1 analog sample voltage signal value by the current to voltage converter circuit 40-1, the FET switch remains in the open state to prevent passage of channel 1 signals. Following an interval that permits the output of the current to voltage converter circuit 40-1 to settle at the voltage level corresponding to the input current level, the timing generator 50 provides a timing pulse T7 to terminals 3 and 8 of both FET switches U10 and U22. The switches are responsive to this timing pulse to transfer the channel 1 analog sample voltage signal value and the stored preceding channel 2 analog sample voltage signal value to buffer amplifiers U23 and U4 of the deglitcher circuits 42-1 and 42-2, respectively, for application to the dual channel low-pass filter 44 with the proper phase relationship.

The deglitcher circuits 42-1 and 42-2 are sample and hold circuits similar to the aforedescribed sample and hold circuits 32-1 and 32-2 that sample the analog sample voltage value signals present at their respective inputs and hold the sampled value for subsequent signal processing. More specifically, FET switch U22 samples and transfers the channel 1 analog voltage signal value provided by the current to voltage converter 40-1 to a holding capacitor C64 coupled to the input to the buffer amplifier U23 of the deglitcher circuit 42-1 and FET switch U10 samples and transfers the channel 2 analog voltage signal value provided by the resampling and hold circuit 40-2 to a holding capacitor C28 coupled to the input of the buffer amplifier U4 of the deglitcher circuit 42-2. As described hereinbefore, the sampling and transferring takes place in response to the T7 timing pulse, which occurs after the voltage signals at the inputs of the FET switches U22 and U10 have settled. In this manner, the deglitcher circuits 42-1 and 42-2 eliminate any transients that may be present in the output of the D/A converter 38.

The dual low-pass filter 44 is comparable to the dual low pass filter 30 and receives the analog sample voltage signal values from the deglitcher circuits 42-1 and 42-2 and generates therefrom the two channels of analog audio signals. The analog audio signals provided by the dual low-pass filter 44 are coupled to the delayed analog output circuit 28 which is a dual channel output circuit. From here, the signals are applied to the disk lathe 22 to drive the cutting head to cut the appropriate signals into the record disk.

Figure 5:
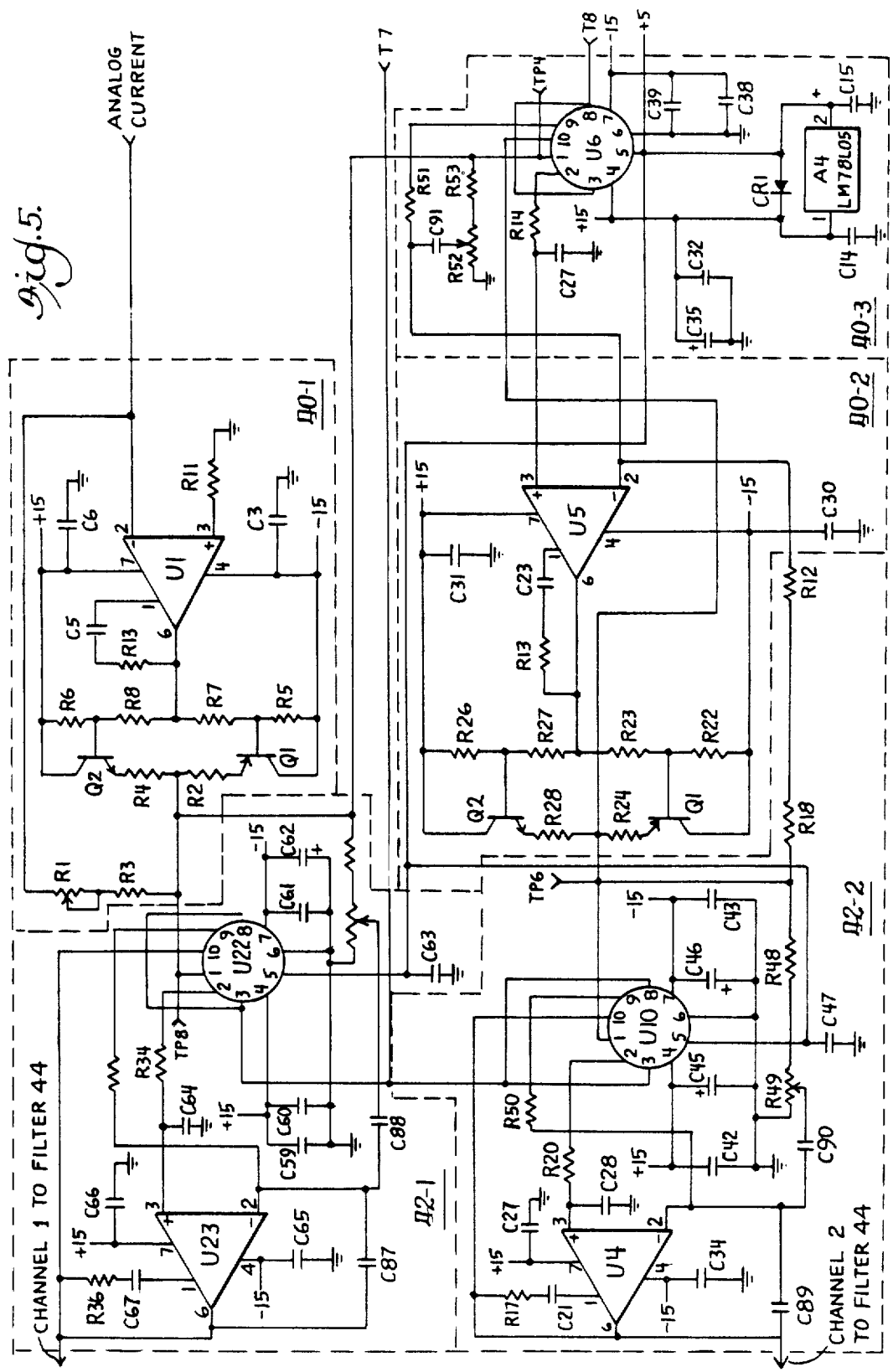
FIG. 5 is a schematic diagram illustrating preferred forms of current to voltage converter and deglitcher circuits utilized in the system illustrated in FIG. 1.

The timing pulses T7 and T8 are generated by the timing generator 50 illustrated in FIG. 5 at a 50 kHz rate at particular times relative to the occurrence of a timing reference edge of the 50 kHz square wave SAMPLE RATE signal generated by the master clock generator 48 and applied to the timing generator 50.

Figure 6:
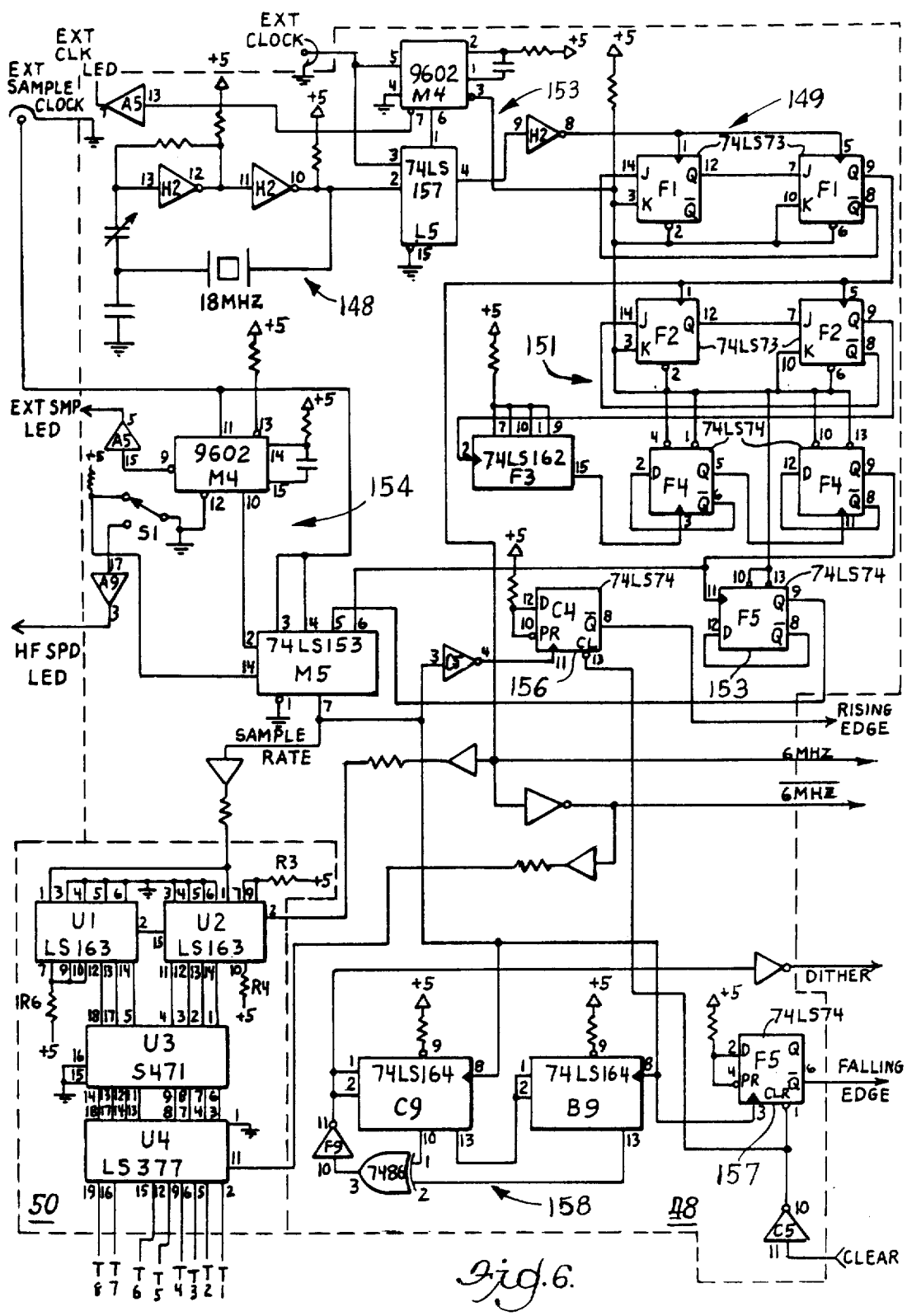
FIG. 6 is a circuit diagram illustrating preferred forms of master clock and timing generator circuits used in the system illustrated in FIG. 1.

In FIG. 6 are illustrated preferred forms of the master clock 48 and the timing generator 50. The master clock 48 comprises a crystal controlled oscillator indicated generally at 148 operating at a frequency of 18 MHz that serves as the basic internal timing source. The required timing and clock signals are generated from the 18 MHz master clock signal by dividing the oscillator frequency. A divide-by-3 divider 149 produces 6 MHz clock pulse signals shown as outputs 6 MHz and $\overline{6\,\text{MHz}}$, which are used throughout the digital delay system. The output of the divide-by-3 divider 149 is also coupled to a divide-by-120 divider circuit indicated generally at 151, which produces the 50 kHz SAMPLE RATE clock signal. A following divide-by-2 divider 153 produces a 25 kHz SAMPLE RATE clock signal.

The master clock 48 is arranged to select between internal and external timing control and between 25 kHz and 50 kHz SAMPLE RATE clock signals. Two multiplexer and timing signal source detector circuits 153 and 154 serve to condition the master clock 48 in accordance with the selected timing control and SAMPLE RATE clock signal. Each of the circuits includes a one-shot detector having its trigger input coupled to the external clock terminal and its output coupled to the associated multiplexer. Whenever an external clock signal is present at the external clock terminal, the one-shot detector of each of circuits 153 and 154 conditions the associated multiplexer to pass the external clock signals in place of the internally generated 18 MHz master and SAMPLE RATE clock signals. When a switch 51 is closed to ground pin 14 of the clear input of the one-shot detector of circuit 154, the associated multiplexer is conditioned to pass the internally generated 25 kHz SAMPLE RATE clock signal provided by the divide-by-2 divider 153 in place of the internally generated 50 kHz SAMPLE RATE clock signal provided by the divide-by-120 divider 151.

The selected SAMPLE RATE clock signal is coupled together with the 6 MHz and $\overline{6\,\text{MHz}}$ clock signals to the timing generator 50 that operates to generate the aforementioned timing pulses T1 through T8. Each rising edge of the SAMPLE RATE clock signal clears a counting circuit comprised of counter U1 and U2 to start it counting the 6 MHz clock pulses. The binary outputs of the counters are coupled to a PROM U3 that stores a state table, which determines the numbers of 6 MHz clock pulses required to be counted, hence, when the timing pulses are generated by the PROM. The state table for the PROM U5 and the times of issuance and duration of the timing pulses are indicated in the following table.

| COUNTER OUTPUT | PROM STATE | TIMING PULSE |
|---|---|---|
| 000000000 | 11111111 | None |
| 000000001 | 11100000 | T1, T2, T3, T4, T5 |
| . | . | |
| . | . | |
| 000001110 | 11110011 | T3, T4 |
| . | . | |
| . | . | |
| 000010000 | 01111111 | T8 |
| . | . | |
| . | . | |
| 000111100 | 00011111 | T6, T7, T8 |
| . | | |
| 001001001 | 01111111 | T8 |
| 001001010 | 11111111 | None |
| To End of Count | | |

Only those binary counts of counter U1 and U2 causing a stage change in the PROM U3 and concomitant timing pulse output condition change are illustrated in the table. Although the counters U1 and U2 count 120 of the 6 MHz clock pulses between consecutive rising edges of the 50 kHz SAMPLE RATE signal, no timing pulses are generated by the PROM U3 after the counters have counted 74 of the 6 MHz clock pulses. The timing pulses generated by the PROM U3 are clocked through a following latch U4 by the 6 MHz clock signal to remove glitches.

The SAMPLE RATE clock signal provided by the multiplexer of the circuit 154 is also coupled to a pair of flip-flop 156 and 157 and dither circuit 158. The two flip-flops generate RISING EDGE and FALLING EDGE signals, respectively at times corresponding to such edges of the SAMPLE RATE clock signal. The dither circuit 158 is clocked by the SAMPLE RATE clock signal to generate a pseudo random sequence of high and low logic levels on its DITHER output line. This random sequence of high and low logic levels is summed with the analog audio signal in the respective sample and hold circuits 32-1 and 32-2 to produce a varying signal level that establishes a noise floor in the digitized signal generated by the cooperative action of the sample and hold circuit 32 and the A/D circuit 34.

In FIG. 7A is illustrated a preferred form of the encoder circuit 46-1 portion of the microprogrammed controller 46, and in FIG. 7B is illustrated a preferred form of the decoder 46-2 portion of the microprogrammed controller 46. The encoder circuit 46-1 includes a PROM counter D3, D4 and PROM's D1 and D2. The output of the PROM D1 determines whether a jump instruction is to be executed, a data transfer instruction is to be executed or a memory access instruction is to be executed and in which of the two channels the data transfer operation occurs. The output of the PROM D2 determines the address for the jump instruction and data transfer and control function required by the memory access operation. More specifically, the PROM counter D3, D4 is set to zero upon receipt of the RISING EDGE signal received by the encoder circuit 46-1 from the master clock 48, which enables the counter to count 6 MHz clock pulse received from the master clock 48. The binary outputs of the counter are coupled to the PROMs D1 and D2 that stores the program executed by the microprogrammed controller 46. The counter inputs to and the responsive outputs from the PROMs D1 and D2 are indicated in the following table.

| COUNTER BINARY OUTPUT | PROM D2 OUTPUT | PROM D1 OUTPUT |
|---|---|---|
| 0 | 01001000 | 00000001 |
| 1 | 01101001 | 00000101 |
| 2 | 11101001 | 00000110 |
| 3 | 11101011 | 00010110 |
| 4 | 00001001 | 00000111 |
| 5 | 11111001 | 10000110 |
| 6 | 11111011 | 10010110 |
| 7 | 11111001 | 00100000 |
| 8 | . | 00100010 |
| 9 | 11111011 | 00100011 |
| 10 | . | 00100101 |
| 11 | 11111001 | 00001111 |
| 12 | 11111101 | . |
| 13 | . | 00100000 |
| 14 | 11110101 | . |
| 15 | . | . |
| 16 | 11111001 | 11110010 |
| 17 | . | 00001111 |
| 18 | 11111101 | . |
| 19 | 11111001 | 11110010 |
| 20 | 01111001 | 00010110 |
| 21 | 00101001 | 00101101 |
| 22 | 11111001 | 11110101 |
| 23 | . | 00001111 |
| 24 | 11111101 | . |
| 25 | . | 00011111 |
| 26 | 11110101 | . |
| 27 | . | 11110001 |
| 28 | 01011000 | 00011101 |
| 29 | 01111001 | 00100001 |
| 30 | 11101001 | 01001100 |
| 31 | 11101011 | 01011100 |
| 32 | 00001001 | 00100011 |
| 33 | 11101001 | 11001100 |
| 34 | 11101011 | 11011100 |
| 35 | 11101001 | 00100110 |
| 36 | . | 00101000 |
| 37 | 11101011 | 00101001 |
| 38 | . | 00101011 |
| 39 | 11111001 | 00001111 |
| 40 | 11111101 | . |
| 41 | . | 00100000 |
| 42 | 11110101 | . |
| 43 | . | . |
| 44 | 11111001 | 11110101 |
| 45 | . | 11110011 |
| 46 | 00011001 | 00110000 |
| 47 | 11111001 | 11110100 |
| 48 | . | 00001111 |
| 49 | 11111101 | . |
| 50 | . | 00011111 |

| COUNTER BINARY OUTPUT | PROM D2 OUTPUT | PROM D1 OUTPUT |
|---|---|---|
| 51 | 11110101 | . |
| 52 | . | 11110001 |
| 53 | 00001001 | 00000000 |

The appearance of a dot symbol in the columns of the table signifies no change in the PROM output for a change in the counter output.

The outputs of the PROM's D1 and D2 are latched into latches L7 and L8, respectively, by the 6 MHz clock signal provided by the master clock 48. Latch L7 couples the PROM D1 output to the controller bus 74, which extends to the address input of counter D3, D4 and to the decoder circuit 46-2 of the microprogrammed controller 46. The six most significant bit outputs of the latch L8 are coupled to the decoder C2 and multiplexer A9. The decoder C2 provides an output on lines 76 that identifies whether a data transfer or memory access instruction is being placed on controller bus 74. Line 78 is activated when a jump type of instruction is placed on the controller bus 74. Three types of jump instructions occur during the execution of the program stored in the PROM's D1 and D2. A fourth will occur (caused by the occurrence of the FALLING EDGE signal) when the digital delay system is adapted to four channel recording. The multiplexer A9 is responsive to three outputs of the latch L8 to select the jump condition that will cause the counter D3, D4 to jump to the address placed on bus 74 by latch L7. The jump conditions are: unconditional, i.e., determined by the program alone; upon the occurrence of the RISING EDGE signal; and upon the occurrence of the END OF MEMORY signal derived from the comparator 58. The output of the multiplexer A9 and the most significant bit output of the latch L8 are coupled through an OR gate H6-8, 9, 10 that produces a jump signal that loads jump address into the counter D3, D4.

PROM D2 initiates the row address signal RAS, the column address signal CAS and an L/R signal that identifies whether channel 1 or channel 2 is selected. These signals are latched into latch L8 for application to the memory 36 over memory control bus 73. In the memory, the RAS and CAS signals are used to form the $\overline{RAS}$ and $\overline{CAS}$ signals.

In the general operation of the encoder circuitry 46-1 of the microprogrammed controller 46, the RISING EDGE signal starts the operation of the encoder 46-1 which then is stepped through its program by the 6 MHz signal. (The FALLING EDGE signal is utilized in four channel recording; however, as this mode has not been illustrated in the other figures, it need not be considered here). When the counters D3 and D4 are stepped from the zero count state to the one count state, a CLEAR signal is sent to the counters D3 and D4 to count and, also, to master clock 48 to clear the D flip-flops F5-1, 2, 3, 4, 6 and C4-8, 10, 11, 12, 13 so that a subsequent SAMPLE RATE signal may initiate RISING EDGE and FALLING EDGE signals.

In the decoder circuit 46-2 shown in FIG. 7B, the signals on the controller bus 74 are applied to appropriate decoders B1, B2, B3 and B4, where they are decoded pursuant to the instructions received over lines 76. The decoders produce appropriate signals at the appropriate times in the cycle pursuant to the instructions from the PROMS D1 and D2. Such signals include signals WRITE, WRCLK1, WRCLK2, RDCLK, WREN, and REN, which are transmitted to the memory 36 over the memory control bus 73 to institute various data manipulations. The WRITE signal is used to generate the $\overline{W}$ signal. The WRCLK1 and WRCLK2 signals are decoded from the L/R channel identifying signal by the channel decoder 161 and used to clock data from the data bus 70 into input latches in the memory 36 for the respective channels. The RDCLK signal is used to clock data from memory to read latches in the memory 36. The WREN signal enables write latches in the memory 36. Certain of the output lines of the decoder 46-2 are provided with D-type latches that are clocked by the 6 MHz and the 6 MHz clock signals to remove glitches.

The remaining control signals from the microprogrammed controller 46, VIZ., MEMORY REFRESH, ADDRESS INCREMENT, ADDRESS CLEAR, ROW ADDRESS ENABLE and COLUMN ADDRESS ENABLE, will be referred to further below in the connectin with the uses of such signals for controlling the memory address counter 52.

The signals on the controller bus 74 are applied to the input of a tristate buffer A4, which when enabled, produce appropriate 4-bit binary state control signals on the receiver and sender busses 80 and 82. These control signals are applied to 4-bit binary state decoders, such as the decoder 68 shown in FIG. 2 and decoder U9 shown in FIG. 4. The decoder decodes these signals as described above. Thus, all of the control operations are synchronized by the microprogrammed controller 46 and the timing generator 50 as clocked by the master clock 48 in order that the appropriate functions of the circuit are performed at the appropriate times.

In FIG. 8 are illustrated preferred forms of the memory address counter circuit 52 and the address to time delay converter 54. At the end of each address cycle as determined by the END OF MEMORY signal, the microprogrammed controller 46 produces at pin 11 of the decoder B4 an ADDRESS CLEAR signal. This signal is coupled to clear counters E1, E2, E4, E5 and E7 of the memory address counter circuit 52 and clears the counter dividers E8 and E9 of the address to time delay converter 54. Thereafter, the microprogrammed controller 46 produces at pin 12 of decoder B4 an ADDRESS INCREMENT signals at the 50 KHz sample clock rate, which is coupled to increment the aforementioned counters and dividers.

The ADDRESS INCREMENT signals are applied to the counting inputs of counters E7, E8 and E9 of the memory address counter circuit 52 and the address to time delay converter 54, respectively. The memory address counter circuit 52 responds to such signals by producing at the outputs of the counters E1, E2, E4, E5 and E7 an indication of the memory address. The row address signals are applied to a tristate buffer E6 whereas the column address signals are applied to a tristate buffer E3. The remaining counter output signals are for identifying the particular memory array addressed and are applied to the memory 36 over array address bus 83. The tristate buffer E6 is enabled by a ROW ADDRESS ENABLE signal applied at the appropriate time from the decoder B2, pin 15, of the microprogrammed controller 46. When enabled, the tristate buffer E6 supplies the row address signals to the address bus 72. Similarly, at the appropriate time, a COLUMN ADDRESS ENABLE signal is applied from the decoder B2, pin 14, to enable the tristate buffer E3, thereby placing the column address signal on the address bus 72. The application of these row address signals and column address signals are synchronized with the appropriate $\overline{RAS}$ and $\overline{CAS}$ signals applied to the memory arrays as described above in connection with FIG. 3. The signals indicating the respective memory arrays addressed are directed to a comparator and decoder in the memory circuit 36. Such comparator selects the appropriate memory array.

The particular memory arrays used in the construction of the above-described preferred embodiment of the memory circuit 36 requires refreshment every 2 ms. Refreshing is conveniently performed by changing the state of the most significant bit of the row address signals following the write interval of each addressing of the memory circuit 36. The microprogrammed controller 46 effects this by issuing MEMORY REFRESH and ROW ADDRESS ENABLE signals to the memory address counter 52 and a RAS signal to the memory circuit 36. This activates the row select lines of the entire memory circuit 36 for refreshing operations. In this manner, refreshing of the entire memory is guaranteed within the required 2 ms interval regardless of the amount of the memory being used to provide the desired time delay. Refreshing is achieved by applying to the memory address counter 52 during each addressing of the memory circuit 36 a MEMORY REFRESH signal from the decoder B4 of the microprogrammed controller 46. The memory address counter 52 responds to the MEMORY REFRESH signal by producing the aforementioned state change in the row address select signal.

The ADDRESS INCREMENT signal is applied to the dividers E8 and E9 of the address to time delay converter 54. The dividers E8 and E9 divide the number of counts applied to produce an output 10 ms INCREMENT signal indicative of the counting of the number of ADDRESS INCREMENT pulses occurring in 10 ms. At a sampling rate of 50 kHz, this represents to preload the dividers to 250 counts, whereby only 250 counts are needed to produce a 10 ms INCREMENT pulse. A 6 MHz signal is applied to the counters E1, E2, E4, E5 and E7 for synchronization.

The 10 ms INCREMENT signal is applied to the current time delay counter 56, a preferred form of which is illustrated in FIG. 9. The counters D6, D7 and D8 are cleared by the same ADDRESS CLEAR signal that clears the counters of the address to time delay converter 54. Thus, the counters D6, D7 and D8 of the current time delay counter 56 count the number of 10 ms increments and produce a count on their output terminals indicative of the number of 10 ms increments occurring since the ADDRESS CLEAR signal. These signals are then applied in binary coded decimal form to the comparator 58 over lines 84. The output of the counter D6 represents seconds, the output of counter D7 represents tenths of seconds, and the output of the counter D8 represents hundredths of seconds.

A preferred form of the comparator 58 is illustrated in FIG. 10. As here shown, the signals applied over the lines 84 are applied to comparators C6, C7 and C8 of the comparator circuit 58. The comparators C6, C7 and C8 compare these signals with binary coded decimal signals received on lines 86 from the desired time delay register 60, a preferred form of which is illustrated in FIG. 9.

The desired time delay register 60 is comprised of three counters, B6, B7 and B8, which produce output signals in the binary coded decimal format, the output of the counter B6 indicating seconds, the output of the counter B7 indicating tenths of seconds, and the output dividing by 500. If a sampling rate of 25 kHz is used, a switch S1 (which may be the same switch S1 as shown in FIG. 6) is moved to the 25 kHz position of the counter B8 hundredths of seconds. The desired time delay register 60 may be loaded by the select delay circuit 62 as shown in FIG. 10. This circuit applies pulses to a line 88 for causing the desired time delay register 60 to count up and over line 90 for causing the desired time delay register to count down. To cause the select delay circuit to count up, an up enable signal UP EN is applied to a NAND gate H8-8, 9, 10, 11 to which an UP/DN CLK signal is also applied. The UP/DN CLK is produced by a standard clock circuit that increases in frequency the longer it is running. The UP EN signal may be from a button pushed on a front panel. The NAND gate H8-8, 9, 10, 11 then produces counts on the line 88 to cause the counter of the desired time delay register 60 to count up as long as the UP EN signal is applied or until an enabling signal UP DIS is removed from the third input of the NAND gate. The latter occurs when the count reaches the capacity of the memory circuit 36 so that the total count in the desired time delay register 60 does not exceed the total time available in the memory. Similarly, the counters B6, B7 and B8 may be caused to count down by applying a DWN EN signal to a NAND gate H8-3, 4, 5, 6, which also receives the UP/DWN CLK input and an input from a NAND gate H8-1, 2, 12, 13. The NAND gate H8-1, 2, 12, 13 receives inputs from three NOR gates to produce a signal when the counts in the counters B6, B7 and B8 are all zero. The output of the NAND gate H8-1, 2, 12, 13 thus disables the down count signals on the conductor 90 to keep the counters B6, B7 and B8 from counting down past all zeros.

In order that the operator may see what numbers are in the desired time delay register 60, the outputs thereof are applied to conventional indicators in the delay indicator circuit 64 shown in FIG. 9. Such signals are applied in binary coded decimal form over lines 92. The operator then can run the number up or down as he wishes, to obtain the desired time delay in the desired time delay register 60.

Alternatively, for providing certain preselected delays to the desired time delay register 60, a preselect delay circuit 66, as shown in FIG. 9, may be utilized. Such predetermined delays may be entered by setting thumb wheel switches 94 and 96 to put out the selected time in binary coded decimal form. These signals are applied to multiplexed circuits F6, F7 and F8 which operate to select one or the other of the sets of preselected time delays. Selection is then made by applying an appropriate LOAD signal, as by an operator actuated push button, to terminals 1 of the multiplex circuits F6, F7 and F8. A DELAY LOAD signal, as may be applied by an operator actuated push button, is then utilized in connection with a NOR gate A2-4, 5, 6 and the 6 MHz signal to load the preselected time into the desired time delay register 60. Effectively, the 6 MHz signal loads the register 60 when enabled by the DELAY LOAD signal.

However the desired time delay register 60 is loaded, its output is compared in the comparator circuit 58 with the output of the current time delay counter 56. Such comparison is made by the comparators C6, C7 and C8. The comparator C6 produces an output on pin 7 when the output of the counter B6 exceeds the output from the counter D6 and an output on the terminal 5 when the count in counter B6 is less than the count in counter D6. The same sort of output is achieved from the counters C7 and C8 except that an output on pin 6 of the comparator C8 indicates that the two compared signals are equal. A comparator D5 then produces an output signal when the count in the current time delay counter 56 reaches the preset count in the desired time delay register 60. This output signal is the END OF MEMORY signal provided to the microprogrammed controller 46 which then acts, as stated above, to produce an ADDRESS CLEAR signal. This causes the memory address counter 52 to begin its cycle from zero count.

As explained above, the time delay between the audio signal input to the disk lathe pitch controller 24 and the delayed audio signal input to the disk lathe 22 is the time between successive addressing of a memory cell. This time delay is the time it takes for the current time delay counter 56 to count up to the time delay set into the desired time delay register 60. This limits the amount of memory 36 used, as the memory address counter 52 is cleared at that point, and the memory address cycle starts over again. The memory may be said to be a wrap around memory with a capacity effectively limited to the preset time set in the desired time delay register 60.

To summarize the operation of the digital delay system, two channels of audio from a source, such as the tape recorder 20 are applied through the dual analog input circuit 26 and thence through the dual low-pass filter 30 to the dual sample and hold circuits 32. The sample and hold circuits sample the respective audio signals at a suitable sampling rate, such as 50 kHz, and apply the sampled signals at appropriate times to the dual A/D converter 34 which converts the respective sampled signals at appropriate times to the dual A/D converter 34 which converts the respective sampled signals from analog to digital form and places the digital signals in respective latches.

Memory addresses in the memory 36 are accessed so that the digital signals may be written in and read out onto 16 lines of the data bus 70. When the memory is addressed at a particular address, the data present at that address are first read out into latches and then coupled to the D/A converter 38. Following the reading out of data, the data present in the output latches of the A/D converter 34 are written into the memory.

The signals latched into the D/A converter 38 are converted to analog current form and then converted to voltage signals in the current to voltage converter 40. After being deglitched in the deglitcher circuit 42, the signals are applied through the dual low-pass filter 44 and the delayed analog output circuit 28 to the disk lathe 22.

The signals for causing the various acts to occur at the proper time are derived by the microprogrammed controller 46, the master clock 48, and the timing generator 50. The microprogrammed controller 46 also controls the memory address counter 52 to supply appropriate address signals to the memory 36 at appropriate times. The microprogrammed controller 46 increments the address to time delay converter 54 which puts out a count for each 10 ms of memory addresses. The current time delay counter 56 then counts the number of 10 ms intervals up to the time preset into the desired time delay register 60 from the select delay circuit 62 or the preselect delay circuit 66. The time between writing in and reading out a particular sample is that time which is set into the desired time delay register 60.

Although a preferred embodiment of the invention has been disclosed, various modifications may be made within the scope of the present invention. For example, rather than having the time delay determined by the effective length of the memory 36, memory addresses may be addressed separately for reading and writing. This may be achieved by modifying the memory address control to include two sets of counters, one for controlling write operations starting from zero and the other for controlling read operations starting from a preloaded count corresponding to the desired delay. Such preloading could come from an appropriate time delay register in which the time was set in the manner indicated above. Also as indicated above, the system may be suitably modified for four channel operation. It is also possible to operate with an external clock as applied at the terminal EXT CLOCK and indicated at EXT CLK LED or an external sampling clock as applied at the terminal EXT SAMPLE CLOCK and indicated at EXT CLK LED. The 25 kHz sample rate may be indicated at HF SPD LED. Furthermore, by using two D/A converters, the above-described serialization-deserialization can be avoided.

What is claimed is:

1. A digital delay apparatus for use in a disk mastering preview system wherein audio signals from an audio source are delayed by a predetermined and adjustable time delay for previewing the audio signals to be recorded by a disk lathe, characterized by sampling means for sampling the audio signal to produce analog sample signals of said audio signal; analog to digital conversion means for converting said analog sample signals to digital sample signals; memory means for storing said digital sample signals and having a sufficient number of memory address locations to store the number of digital sample signals that correspond to the maximum predetermined delay; means for addressing said memory locations and for controlling the writing and reading of said digital sample signals into and out of said memory means at said address locations, respectively, said addressing means successively addressing said address locations of said memory means at a predetermined rate corresponding to the rate at which said analog samples were taken, the total number of address locations of said memory means that are addressed corresponding to the number of digital sample signals that occur during the predetermined delay, said addressing and controlling means being operable to sequence through said number of address locations and read the digital sample signals from each address location followed by writing a new digital sample signal at each address location before the next address location is addressed, the total number of address locations being addressed being adjustable in accordance with the amount of delay that is desired; and digital to analog conversion means for converting said digital sample signals read from the memory into analog signals for recording.

2. A disk mastering preview system wherein original audio signals from an audio source are available for previewing a signal to be recorded by a disk lathe and delayed audio signals corresponding to the original audio signals are available for recording by the disk lathe a predetermined time delay thereafter, the predetermined time delay being effected by an adjustable digital delay, characterized by sampling means for periodically sampling the original audio signals at a predetermined rate to produce analog sample signals indicative of the signals sampled, analog to digital conversion means for converting said analog sample signals to corresponding digital sample signals, a memory having a plurailty of memory locations, memory address control means for successively addressing locations in said memory in response to address increment signals, said memory address control means being cleared by an address clear signal for beginning the addressing at a first location after receipt of said address clear signal, means for producing address increment signals at said predetermined rate, means for reading a digital signal from an addressed location in said memory, means for thereafter writing one of said digital sample signals into said addressed location prior to the incrementing of said memory address control means to address another location, counting means responsive to said address increment signals for counting the number of locations addressed, said counting means being cleared by said address clear signal and producing a current time delay signal indicative of said number of locations addressed subsequent to clearing, a predetermined time delay register for producing a predetermined time delay signal, means for setting said predetermined time delay register to produce a time delay signal corresponding to the time delay desired, comparator means for comparing said predetermined time delay signal with said current time delay signal and producing an address clear signal when said compared signals are equivalent, means for applying said address clear signal to said memory address control and said counting means, and digital to analog conversion means for converting said digital sample signals read out of said memory locations into analog signals for recording.

3. A digital delay system for delaying digital signals by a predetermined interval of time, said system including a memory having a plurality of memory locations, memory address control means for cyclically successively addressing locations in said memory, means for reading a digital signal from an addressed location in said memory, means for thereafter writing a digital signal into said addressed location prior to the addressing of another location, and means for adjusting the number of locations addressed per cycle by said memory address control means in accordance with the amount of delay that is desired.

4. A digital delay apparatus for delaying digital signals by a predetermined interval of time including memory means for storing digital signals and having a sufficient number of memory address locations to store the number of digital signals that correspond to the maximum predetermined delay, said system being characterized by means for addressing said memory locations and for controlling the writing and reading of said digital sample signals into and out of said memory means at said address locations, respectively, said addressing means successively addressing said address locations of said memory means, the total number of address locations of said memory means that are addressed corresponding to the number of digital signals that occur during the predetermined delay, said addressing and controlling means being operable to sequence through said number of address locations and read the digital signals from each address location followed by writing a new digital signal at each address location before the next address location is addressed, the total number of address locations being addressed being adjustable in accordance with the amount of delay that is desired.

5. A digital delay system for delaying digital signals by a predetermined interval of time, said system including a memory having a plurality of memory locations, memory address control means for successively addressing locations in said memory in response to address increment signals, said memory address control means being cleared by an address clear signal for beginning the addressing at a first location after receipt of said address clear signal, means for producing address increment signals at a predetermined rate, means for reading a digital signal from an addressed location in said memory, and means for thereafter writing a digital signal into said addressed location prior to the incrementing of said memory address control means to address another location, characterized by counting means responsive to said address increment signals for counting the number of locations addressed, said counting means being cleared by said address clear signal and producing a current time delay signal indicative of said number of locations addressed subsequent to clearing, a predetermined time delay register for producing a predetermined time delay signal, means for setting said predetermined time delay register to produce a time delay signal corresponding to the time delay desired, comparator means for comparing said predetermined time delay signal with said current time delay signal and producing an address clear signal when said compared signals are equivalent, and means for applying said address clear signal to said memory address control and said counting means.

* * * * *